United States Patent
Tanaka

[19]

[11] Patent Number: 5,824,197
[45] Date of Patent: Oct. 20, 1998

[54] SHIELD FOR A PHYSICAL VAPOR DEPOSITION CHAMBER

[75] Inventor: Yoichiro Tanaka, Narita, Japan

[73] Assignee: Applied Materials, Inc., Santa Clara, Calif.

[21] Appl. No.: 658,771

[22] Filed: Jun. 5, 1996

[51] Int. Cl.⁶ .................................................. C23C 14/34
[52] U.S. Cl. .............................. 204/192.12; 204/298.11; 204/298.19
[58] Field of Search ................ 204/192.12, 298.11, 204/298.19

[56] References Cited

U.S. PATENT DOCUMENTS

| | | | |
|---|---|---|---|
| 4,927,513 | 5/1990 | Schultheiss et al. | 204/298.11 X |
| 4,946,576 | 8/1990 | Dietrich et al. | 204/298.11 X |
| 5,112,467 | 5/1992 | Zejda | 204/298.11 X |
| 5,362,372 | 11/1994 | Tepman | 204/298.11 X |
| 5,382,339 | 1/1995 | Aranovich | 204/298.11 X |
| 5,403,459 | 4/1995 | Guo | 204/298.11 X |

FOREIGN PATENT DOCUMENTS

| | | | |
|---|---|---|---|
| 40/3274265 | 12/1991 | Japan | 204/298.11 |
| 40/4013868 | 1/1992 | Japan | 204/298.11 |
| 40/5078834 | 3/1993 | Japan | 204/298.11 |
| 40/6299322 | 10/1994 | Japan | 204/298.11 |

*Primary Examiner*—Nam Nguyen
*Attorney, Agent, or Firm*—Birgit E. Morris; Donald Verplancken

[57] ABSTRACT

A target shield having a concave, curved surface away from a target in a physical vapor deposition chamber spaced so that the number of magnetic field lines that intersect said shield are reduced, results in improved vertical directionality of the sputtered material. High aspect ratio openings in a substrate can be filled at low pressures, e.g., 3 millitorr and lower, using this shield.

6 Claims, 3 Drawing Sheets

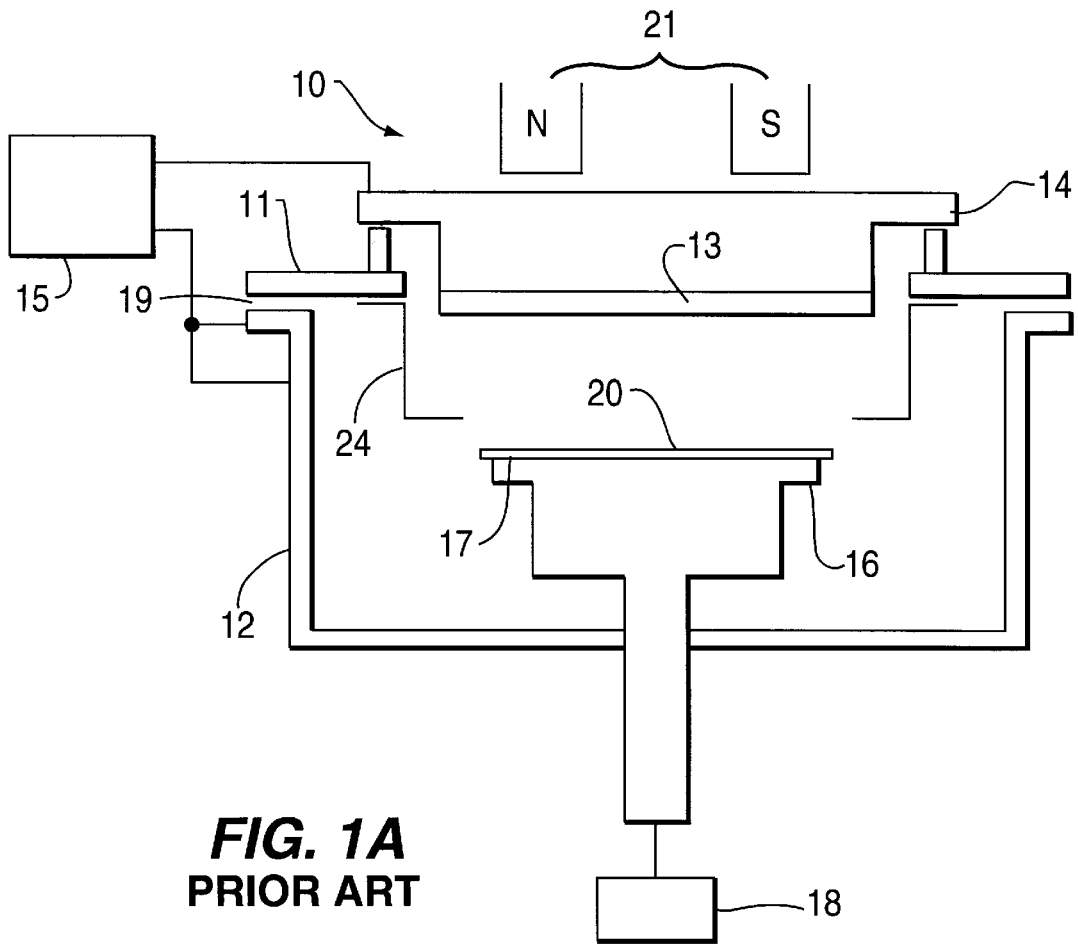
FIG. 1A
PRIOR ART
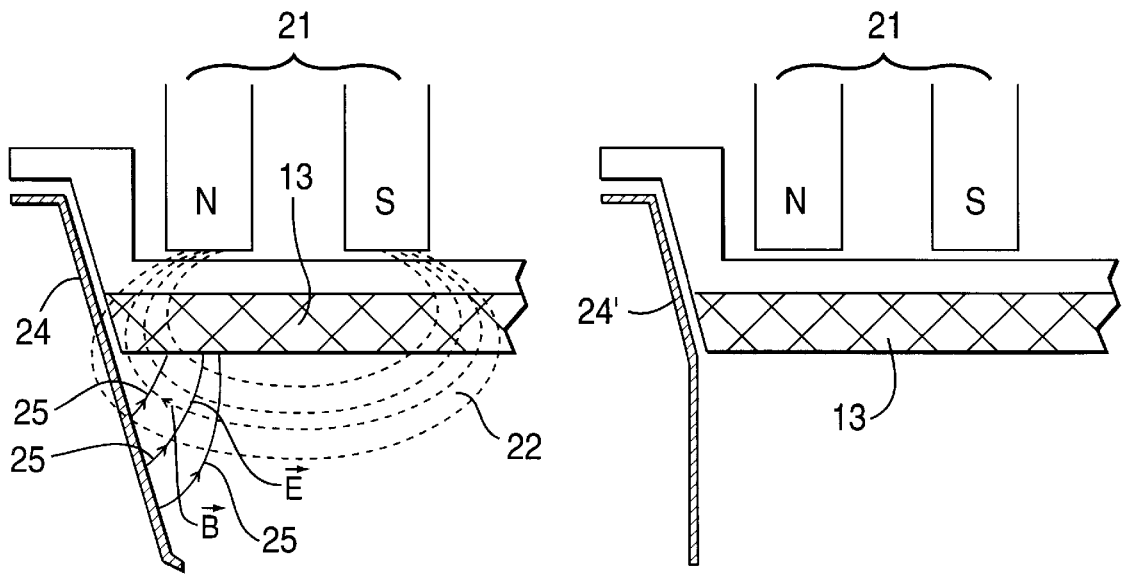
FIG. 1B
PRIOR ART
FIG. 1C
PRIOR ART KEY: $\vec{E}$: ELECTRICAL FIELD VECTOR
$\vec{B}$: MAGNETIC FIELD VECTOR

SHIELD FOR A PHYSICAL VAPOR DEPOSITION CHAMBER

This invention relates to apparatus and method for sputter deposition. More particularly, this invention relates to physical vapor deposition apparatus and method for depositing metals and compounds in high aspect ratio openings using an improved shield.

BACKGROUND OF THE INVENTION

Sputter deposition of materials such as titanium, titanium tungsten, titanium nitride, aluminum, aluminum alloys, tungsten, tungsten silicide, molybdenum silicide, silicon and copper and copper alloys, is conventional. A typical physical deposition chamber (PVD) is shown schematically in FIG. 1A.

Referring to FIG. 1A, a chamber 10, having a top wall 11 and a sidewall 12, includes a target 13 made of the material to be sputtered, or a precursor thereof. The target 13 is mounted on a target support 14 which is connected to a source of power 15. A susceptor 16 for supporting a substrate 20 to be sputtered is mounted so that its top surface 17 is parallel to and spaced from the target 13. The susceptor 16 is also connected to a power source 18. A gas inlet port 19 permits a reactive and/or inert gas to be added to the chamber 10. A magnet pair 21 is mounted behind the target 13. This magnet pair 21 creates a magnetic field about the outer circumference of the target 13 that confines the plasma to the space above the susceptor 16. As shown in FIG. 1B, the magnet pair 21 forms an orthogonal electromagnetic field 22, shown in dashed lines, between the target 13 and the susceptor support 16, enhances the plasma density and improves sputtering efficiency, e.g., increases the deposition rate without adversely affecting the quality of sputtered films.

When a gas flow is started in the chamber 10, the inert gas molecules in the region between the target 13 and the susceptor 16 become ionized and strike the surface of the target 13, displacing molecules of the material of the target 13, which deposit onto the substrate 20.

However, since sputtered material scatters in random directions and the sputtered material thus deposits not only on the substrate 20 but also on the walls 11, 12 and fixtures inside the chamber 10, it is also conventional to mount a shield 24 closely about the periphery of the target 13 that extends toward the substrate 20. Two different prior art shields 24 and 24' are shown in FIG. 1B and FIG. 1C respectively. The shield 24 of FIG. 1B has straight walls, whereas the shield 24' of FIG. 1C has a bend near the target 13. Sputtered material deposits on the shields 24 or 24' rather than on the walls 11, 12 of the chamber 10, thus eliminating or reducing the need to clean the chamber walls. Various methods are known to clean the shield 24, 24' to periodically remove these deposits or to replace the shields in the chamber 10.

The use of a collimator (not shown) mounted between the target 13 and the substrate 20 has been tried to improve the directionality of the sputtered target particles that reach the substrate. A collimator physically blocks or screens out those target particles travelling in paths from the target which are substantially non-perpendicular to the substrate. Nonetheless, it is difficult to fill high aspect ratio openings, i.e., openings wherein the ratio of the diameter to the depth of the opening is higher than about 1:1, even when using a collimator, whereas filling of openings having an aspect ratio of up to 4:1 or higher is desired.

With the advent of micron and submicron design rules, openings into which contact materials such as aluminum are to be sputtered are becoming ever smaller, and the aspect ratio of these openings, i.e., the ratio of the diameter to the depth of the opening, is becoming higher. Thus it is becoming more difficult to completely fill the high aspect ratio openings by sputtering. Since particles sputtered from the target 13 come off in all directions, very few of the sputtered particles impact the substrate 20 in a vertical direction. Thus most of the sputtered material deposits on the top and sidewall surfaces of the opening in the substrate, rather than on the bottom of high aspect ratio openings, and the top of the opening will bridge over, leaving a void as shown in FIG. 2. In FIG. 2, an aluminum layer 40 is deposited into a high aspect ratio opening 41 in a silicon substrate 42, leaving a void 43.

It is known that more bottom filling can be achieved at lower pressures than at higher pressure. However, it is very difficult to maintain a plasma at pressures much below 3 millitorr. Referring again to FIG. 1B, the magnetic field 22 at the periphery of the target 13 is superimposed on the shield 24, so that electrons in the plasma escape from the plasma and impact the shield 24, where they are lost. If a high percentage of electrons are lost under low pressure, thin plasma operating conditions, the plasma becomes extinguished.

A further problem occurs because the direction of the electron field vector created at the outer, circumferential portion of the target 13 causes scattering in more horizontal, rather than more vertical directions, (see sputtering lines 25 of FIG. 1B) and very few sputtered atoms sputter vertically. These problems also cause non-uniform deposition on the substrate 20, with a greater thickness of material sputtered onto the periphery, rather than the center, of the substrate 20. This phenomenon is shown in FIG. 3. FIG. 3 shows a film of sputtered material 54 deposited onto a substrate 50 using the physical vapor deposition chamber of FIG. 1 under low pressure conditions.

Thus it would be highly desirable to provide a sputtering chamber in which a plasma can be maintained at low pressures so that high aspect ratio openings can be filled without the formation of voids.

SUMMARY OF THE INVENTION

We have discovered that a novel, curved, concave shaped shield, mounted so as to provide a spacing between the shield and the surface of a target that is wider than the target in a physical vapor deposition chamber, such that the number of magnetic field lines that intersect the shield are reduced, which thereby improves sputter deposition uniformity at very low pressures. Further, aspect ratio openings in a substrate as high as 4:1 can be filled without voids.

BRIEF DESCRIPTION OF THE DRAWING

FIG. 1A is a schematic view of a physical vapor deposition chamber of the prior art.

FIG. 1B is a schematic view of a prior art shield for a physical vapor deposition chamber.

FIG. 1C is a schematic view of another embodiment of a prior art shield for a physical vapor deposition chamber.

DETAILED DESCRIPTION OF THE INVENTION

Figure 2:
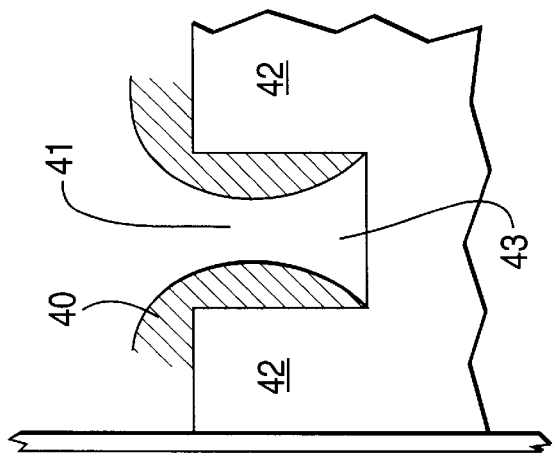
FIG. 2 is a cross sectional view of a partially filled opening in a substrate using a physical vapor deposition chamber of the prior art.
Figure 3:
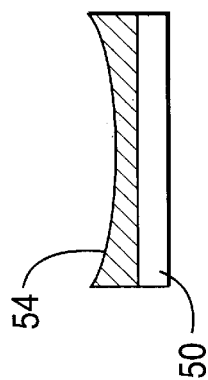
FIG. 3 is a cross sectional view of a deposited film on a substrate using a prior art physical vapor deposition chamber.
Figure 4:
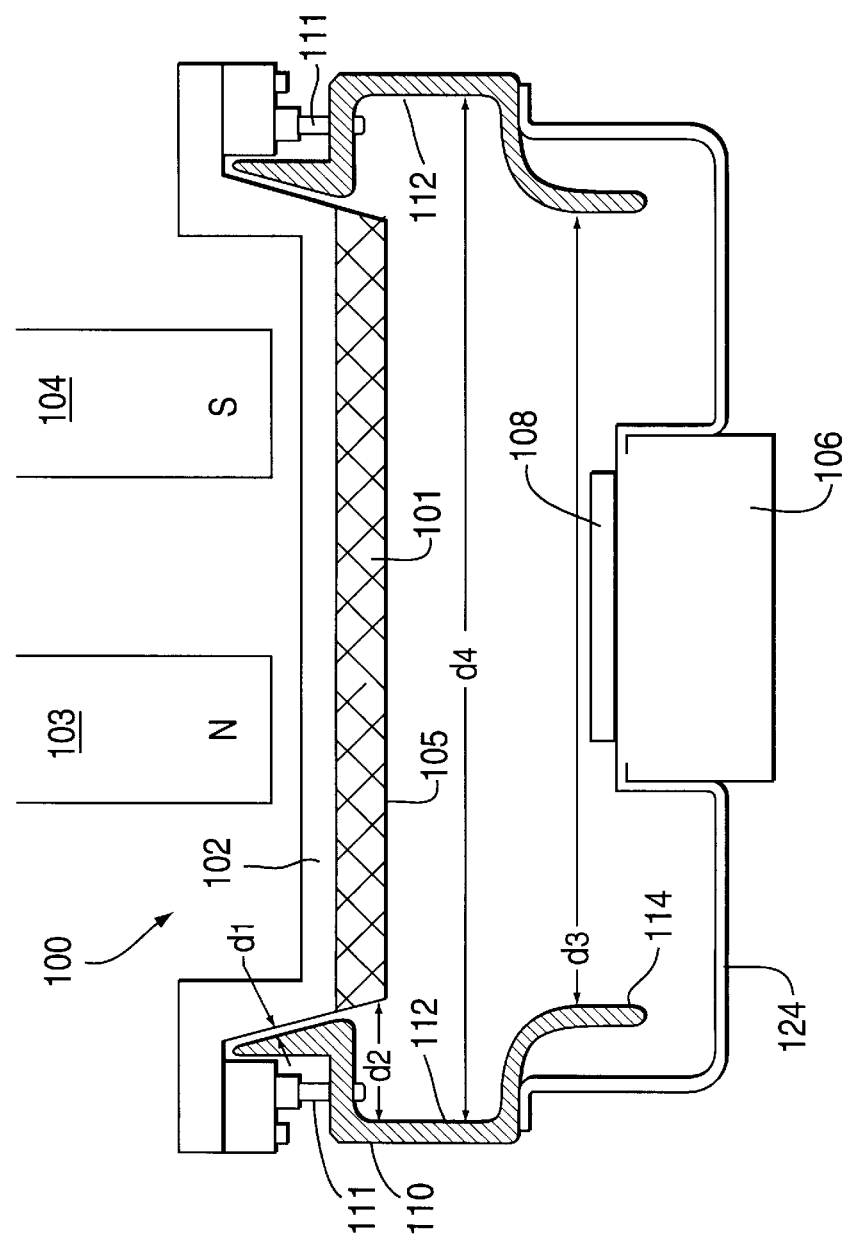
FIG. 4 is a schematic view of a physical vapor deposition chamber of the present invention.

The present invention will be described with reference to FIGS. 4–6. FIG. 4 is a schematic view of a physical vapor deposition chamber 100 modified in accordance with the present invention wherein the prior art shield described in FIG. 1 has been replaced by a shield of the invention.

Referring now to FIG. 4, a target 101 is mounted on a support 102 and has a pair of magnets 103 and 104 mounted on the backside thereof. A susceptor 106 supports a substrate to be coated 108. A shield 110 is mounted to the target support 102 by means of one or more screws 111 so that the shield 110 is spaced a distance d1 from the target 101. The shield 110 has a concave portion 112 that provides additional spacing a distance d2, i.e., about 18 mm, about the periphery of the target 101 adjacent to its sputtering surface 105. The distance d2 is greater than the distance d1.

Figure 5:
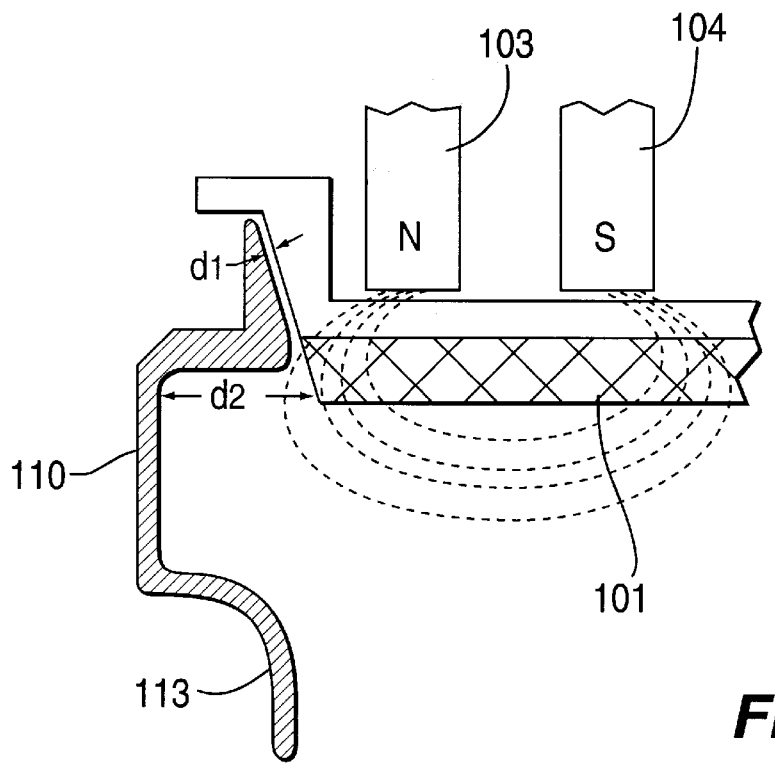
FIG. 5 is a schematic partial view of a shield of the invention adjacent to a target.

Thus, as shown in FIG. 5, which is a schematic view of the top portion of the chamber 100 of FIG. 4, the electric and magnetic field lines (shown as dashed lines) do not reach the shield 110, thus reducing the number of ions lost from the plasma by impacting the shield 110, and also reducing the heating of the shield 110 during processing. The shield 110 of the invention then extends toward the substrate 108 providing a distance d3. This curved shield 110 protects the sidewalls 113 of the sputtering chamber 100 from deposition, but does not interfere with the magnetic field of the target, as can be seen in FIG. 5. Further, since the shield 110 is constructed so as to be spaced from the target, i.e., about 3 mm above the target sputtering surface, fewer electrons impact the shield 110, with the result that fewer electrons are lost from the plasma, and thus the plasma can be maintained even at very low pressures.

After extending downwardly toward, but close to the susceptor 106, e.g., about 36 mm from the concave portion 112, the shield 110 is bent inwardly toward the susceptor 106, and then is bent vertically again, see leg 114 of FIG. 5. Thus the sputtering space, or plasma region, is larger near the target 101, see d4, than near the susceptor 106, see d3.

Referring again to FIG. 4, a second shield 124 can also be mounted so as to surround the susceptor 106 and the substrate 108, to prevent sputtered material from depositing on the bottom wall (not shown) of the chamber 100.

The shields 110 and 124 are made of non-magnetic materials, which can be chosen from an aluminum alloy or a stainless steel for example.

Figure 6:
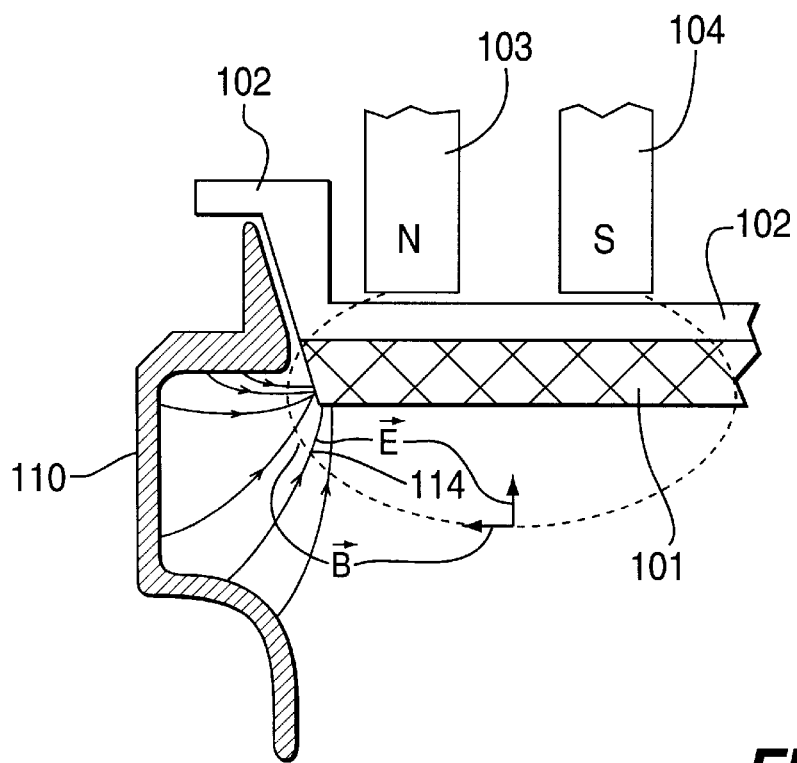
FIG. 6 is a schematic partial view of a shield of the invention and electrical and magnetic field vectors adjacent to a target.

Using the novel shield 110 of the invention, as can be seen in FIG. 6, the direction of the electric field vector 114 near the outer periphery of the target 101 becomes much more vertical with respect to the target 101. The shield structure of the invention has the further effect that the scattering direction of the atoms or ions of sputtered target material is controlled in the vertical direction with respect to the target 101, particularly near the center of the target 101, and thus more molecules and ions impact the substrate 108 in a vertical direction than in prior art chambers such as that shown in FIG. 1. The thickness uniformity of the deposited films is thereby improved. The magnetic field vector B in turn becomes more horizontal, particularly near the center of the target 101.

Electrons in the plasma are enclosed near the target by the direction of the electrical field formed between the target and the shield, and the direction of the magnetic field formed by the magnet. Here, Lorentz force functions on the electron charge accelerated towards the shield 110 from the target 101, and the track is curved. This Lorentz force depends on the vector product of the electrical field (E) and the magnetic flux density (B) and becomes stronger with a stronger electrical field intensity. The electrons in which the track is bent by Lorentz force are arranged in a semicircle, which semicircle becomes smaller as the Lorentz force becomes stronger. The electrons then change their track as they move in the direction of the target, and decelerate in reverse of the electrical field. In this way, the electrons in the plasma execute a circular motion, which is repeated due to the magnetic field.

Looking now to the area near the outer circumference of the target 101, the closer the magnetic field is to being vertical, and the closer the electrical field is toward being horizontal at the outer circumference of the target, i.e., the closer the angle of the electrical field (E) and the magnetic flux density (B) is to 90°, the smaller the radius of the circular motion of the electrons. Consequently the impact probability of the electrons and gaseous molecules, such as argon or nitrogen, is increased, and enhancement of the plasma is obtained. However, if the grounded shield 110 is maintained too close to the target 101, there is a tendency for the electrons in the plasma to escape to the shield 110, reducing the probability for the electrons to impact the gas molecules to dissociate them. Thus at the outer circumference of the target 101, it is necessary to maintain the orientation of the electric field and the orientation of the magnetic field as close to the vertical as possible (perpendicular to the substrate).

On the other hand, in the vicinity of the center of the target 101, the plasma can be more efficiently concentrated the closer the angle composed by E and B becomes to the perpendicular, providing efficient plasma generation.

The shield of the present invention is very effective in enclosing the plasma and in preventing trapping of electrons near the target as compared to conventional shields.

The relation of the curved portion of the shield with respect to the surface of the target is believed to be required to be above the surface of the target. The exact spacing depends on the magnetic flux density of the magnets used, the arrangement of the magnets, and the power applied to the target. However, the outward curvature of the shield should be mounted so that the shield does not intersect the magnetic field lines of the target in order to minimize the loss of electrons from the plasma by impact with the shield. The exact shape of the shield can be varied from a sharp to a gentle curve, but the shield should avoid the magnetic field lines about the target. This ensures that uniform, high quality films of target materials, or of compounds produced from the target material, such as by sputtering a titanium target in the presence of nitrogen to form titanium nitride, will be deposited.

In order to illustrate the improvement in plasma generation at low pressures, three shields were compared; one of the present invention as described above and illustrated in FIG. 4; one of the prior art as shown in FIG. 1; and a modified shield of FIG. 4 wherein the concave portion 112 begins only adjacent to the surface of the target. The data is given below in Table I.

TABLE 1

| Shield | Argon flow, sccm | Nitrogen flow, sccm | Power | Lowest Pressure Plasma is Sustainable |
|---|---|---|---|---|
| FIG. 4 | 16 | — | 5.0 kW | 0.9 mTorr |
| FIG. 4 | 16 | — | 9.0 kW | 0.9 mTorr |
| FIG. 4 | 3 | 28 | 5.0 kW | 1.5 mTorr |
| FIG. 4 | 5 | 45 | 5.0 kW | 2.1 mTorr |
| FIG. 1 | 73 | — | 5.0 kW | 3.7 mTorr |
| mod. FIG. 4 | 68 | — | 5.0 kW | 3.4 mTorr |

The above data show that using a shield of the present invention, a plasma can be sustained at a much lower pressure than using similar or conventional shields.

Using a physical vapor deposition chamber of the invention, sputtering of titanium into high aspect ratio (4:1) openings 0.3 micron in diameter was carried out. The variation of percent fill of the bottom of the opening versus pressure was measured and is given below in Table II below.

TABLE II

| Pressure mTorr | Argon flow, sccm | % Bottom Fill |
|---|---|---|
| 2.0 | 95 | 9.87 |
| 1.5 | 75 | 11.64 |
| 1.0 | 50 | 15.56 |

It is apparent that increased bottom fill (15.56%) was obtained at a low pressure of 1.0 mTorr as compared to only 9.87% bottom fill at 2.0 mTorr pressure.

Although the present invention has been described in terms of specific embodiments, other shapes of the present shield can be made that provide a reduced number of magnetic field lines that intersect the shield, and are meant to be included herein. The invention is only to be limited to the scope of the claims appended hereto.

I claim:

1. A physical vapor deposition chamber comprising
   a target having a front, sputtering surface and a back surface;
   a magnet mounted to the back surface of the target;
   a susceptor for supporting a substrate to be processed mounted parallel to and spaced from said target; and
   a shield that is spaced from and surrounds the target and extends in the direction of the susceptor, said shield having a curved, concave surface at least a portion of, the curved, concave surface being spaced below the surface of said target so as to provide a spacing between the shield and magnetic field lines generated by said magnet.

2. A method of sputter depositing material of a target having a front surface in a physical vapor deposition chamber onto a substrate at a chamber pressure of less than 3 millitorr comprising
   providing a shield having a concave, curved surface mounted in the chamber so that at least a portion of the concave, curved surface being spaced below the front surface of the target, so that a reduced number of magnetic field lines generated by magnets mounted to the backside of the target intersect the shield, and
   sputtering said target material onto said substrate.

3. A method according to claim 2 wherein the pressure is less than 2 millitorr.

4. A method of filling high aspect ratio openings in a substrate by physical vapor deposition comprising
   a) mounting a target having a front, sputtering surface and a magnet mounted on its backside surface in a physical vapor deposition chamber;
   b) providing a shield having a concave, curved surface mounted so that at least a portion of the concave, curved surface being spaced below the front sputtering surface of the target so that the magnetic field lines generated by the magnets that intersect said shield are reduced, and
   c) sputtering material from the target onto said substrate at a chamber pressure of no more than 2 millitorr, whereby improved bottom filling of high aspect ratio openings takes place.

5. A method according to claim 4 wherein the aspect ratio of said openings is about 4:1.

6. A method according to claim 4 wherein the chamber pressure is between about 1 and 2 millitorr.

* * * * *